(12) United States Patent  
Reich-Sprenger

(10) Patent No.: US 7,871,679 B2
(45) Date of Patent: Jan. 18, 2011

(54) GETTER METAL ALLOY COATING AND DEVICE AND METHOD FOR THE PRODUCTION THEREOF

(75) Inventor: Hartmut Reich-Sprenger, Griesheim (DE)

(73) Assignee: Gesellschaft fuer Schwerionenforschung mbH, Darmstadt (DE)

( * ) Notice: Subject to any disclaimer, the term of this patent is extended or adjusted under 35 U.S.C. 154(b) by 1129 days.

(21) Appl. No.: 10/505,254

(22) PCT Filed: Feb. 27, 2003

(86) PCT No.: PCT/EP03/02031

§ 371 (c)(1),
(2), (4) Date: Apr. 6, 2005

(87) PCT Pub. No.: WO03/074753

PCT Pub. Date: Sep. 12, 2003

(65) Prior Publication Data

US 2005/0164028 A1    Jul. 28, 2005

(30) Foreign Application Priority Data

Mar. 5, 2002    (DE) ................................ 102 09 423

(51) Int. Cl.
H05H 1/48    (2006.01)

(52) U.S. Cl. .................. 427/580; 427/540; 427/569; 427/570; 427/571; 427/576; 204/192.38; 204/298.41

(58) Field of Classification Search ............ 204/192.38, 204/298.41; 427/580, 540
See application file for complete search history.

(56) References Cited

U.S. PATENT DOCUMENTS 3,625,848 A * 12/1971 Snaper .................. 204/192.38

5,269,898 A * 12/1993 Welty .................... 204/298.41
5,688,416 A * 11/1997 Johnson ................. 219/121.48
5,932,078 A *  8/1999 Beers et al. ............ 204/298.41
6,468,043 B1 * 10/2002 Benvenuti .................... 417/48

FOREIGN PATENT DOCUMENTS

| DE | 697 19 507 T | | 2/2004 |
| EP | 0 926 258 | | 6/1999 |
| EP | 0926258 A3 | * | 6/1999 |
| JP | 04-334537 | | 11/1992 |
| JP | 2001-503830 A | | 3/2001 |

(Continued)

OTHER PUBLICATIONS

Naidu, M.S.; Kamaraju, V. High Voltage Engineering (2nd edition). (pp. 1-3). McGraw-Hill.*
Naidu, M.S.; Kamaraju, V. High Voltage Engineering (2nd edition, 1996). (pp. 1-3). McGraw-Hill.*

(Continued)

*Primary Examiner*—Michael Cleveland
*Assistant Examiner*—Joel G Horning
(74) *Attorney, Agent, or Firm*—Frommer Lawrence & Haug LLP; Ronald R. Santucci

(57) ABSTRACT

The invention relates to a coating comprising a getter metal alloy and to an arrangement and method for the production thereof. The coating therein consists of a non-vaporizing getter metal alloy (2) for an inner wall (3) of a high-vacuum vessel (4). The arrangement basically consists of a metal plasma generator (7), which in turn comprises an insulator member (8), which carries an ignition electrode (9) and a cathode wire (10) comprising a getter metal alloy (2). Those three components are surrounded by a cage-like anode member (13), which together with the insulation member (8) projects into the high vacuum vessel (5) to be coated and is supplied with cathode potential (12), high-voltage ignition pulse (19) and anode potential (14) by a voltage supply device (16), the anode member (13) together with the high-vacuum vessel (4) being held at ground potential.

9 Claims, 3 Drawing Sheets

FOREIGN PATENT DOCUMENTS

| | | |
|---|---|---|
| JP | 2005-306681 | 11/2005 |
| JP | 2006-145337 | 6/2006 |
| JP | 2007-114541 | 5/2007 |
| RU | 2 022 055 C | 10/1994 |
| RU | 2 034 084 C | 4/1995 |
| RU | 94045807 A | 8/1996 |
| RU | 2 138 686 C | 9/1999 |
| SU | 1466264 A | 12/1992 |
| SU | 1 529 765 A | 1/1996 |
| WO | WO 94/02958 A | 2/1994 |
| WO | WO 96/17171 A | 6/1996 |
| WO | WO 97/17542 | 5/1997 |
| WO | WO 97/49109 | 12/1997 |
| WO | WO 97/49109 A | 12/1997 |
| WO | WO 98/37958 | 9/1998 |
| WO | WO 00/61832 | 10/2000 |
| WO | WO 03/074753 A | 9/2003 |

OTHER PUBLICATIONS

The Great Encyclopaedia Dictionary, Chemistry, ed by I.L. Knunyantz, 2 pages in Russian, published 2000.

Schvedkov's Handbook Dictionary for Power Metallurgy, 2 pages in Russian, published 1982.

* cited by examiner

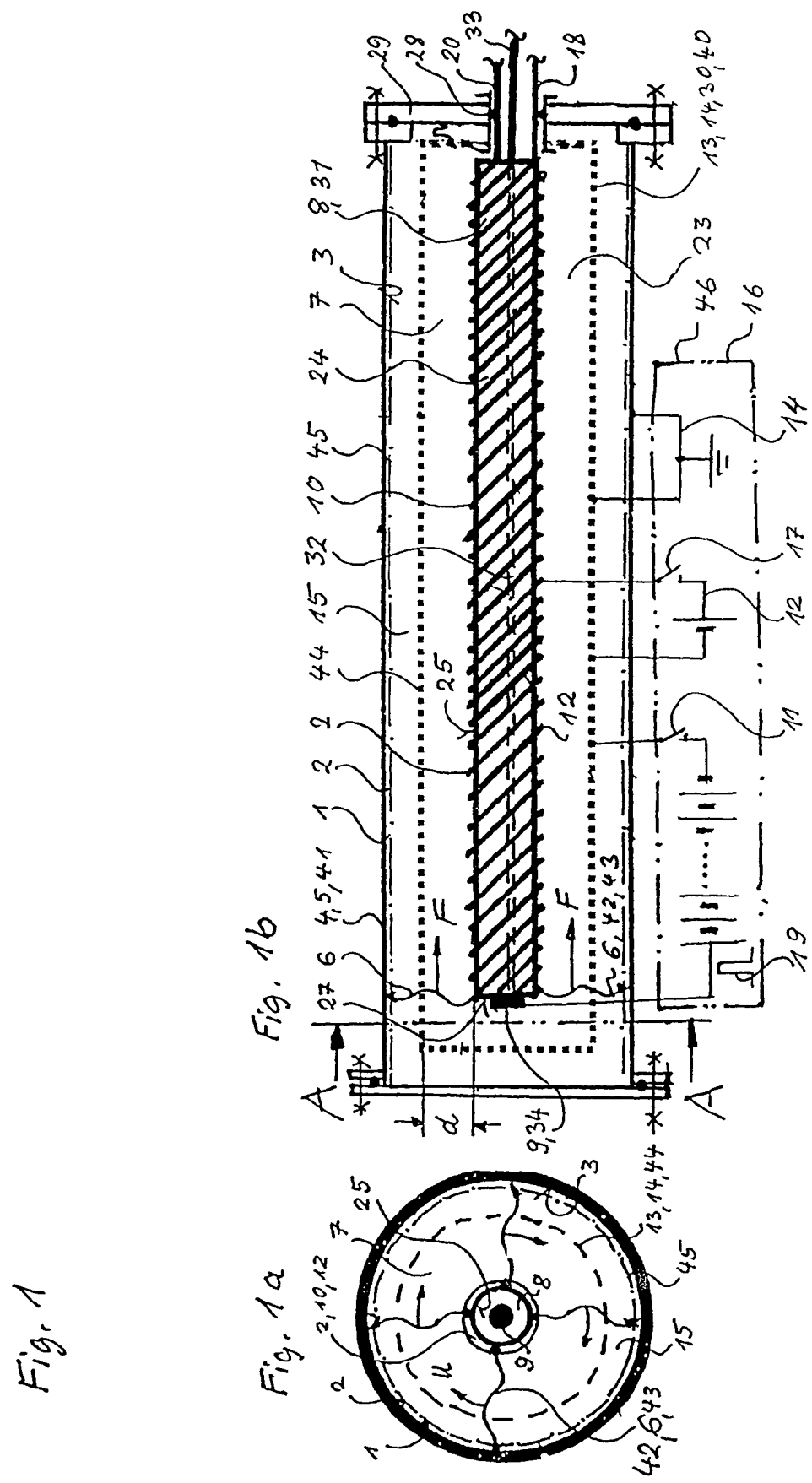

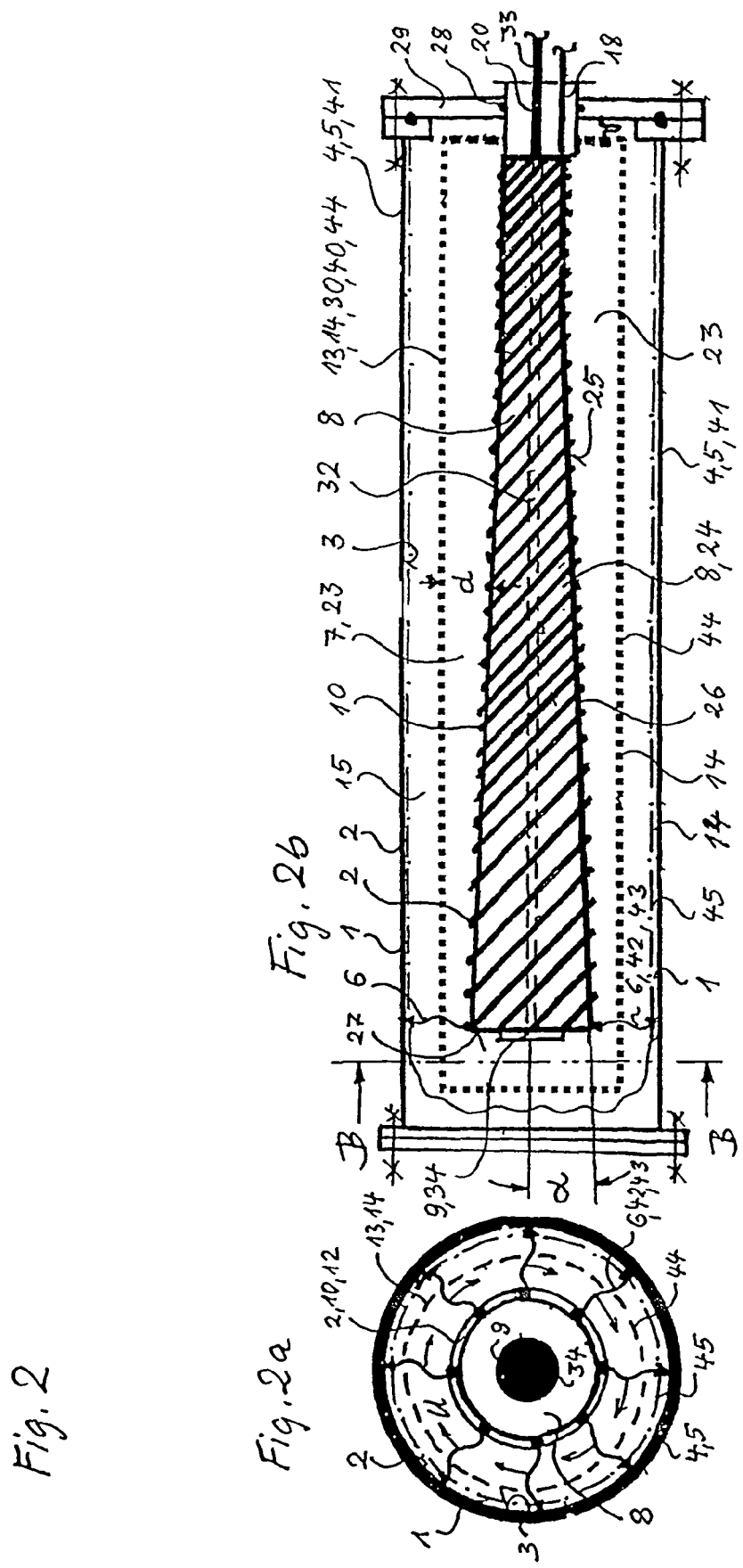

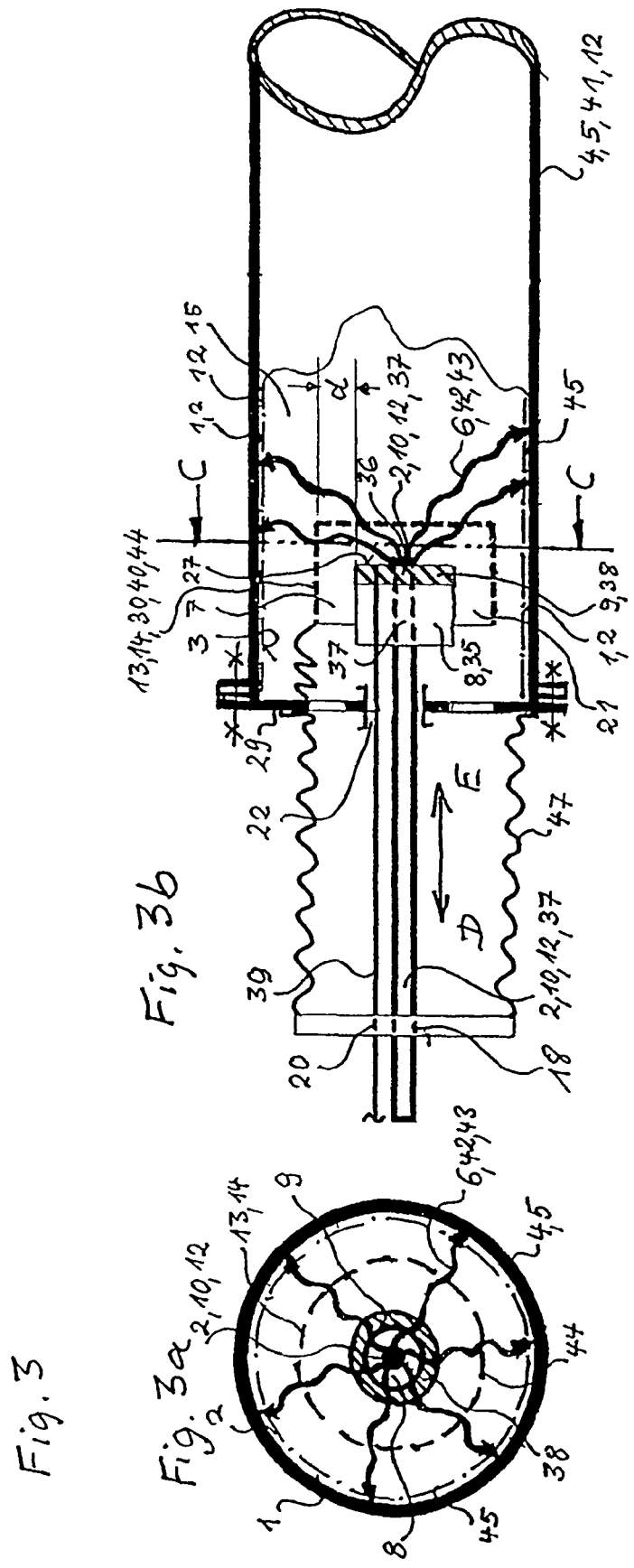

GETTER METAL ALLOY COATING AND DEVICE AND METHOD FOR THE PRODUCTION THEREOF

This application is a 371 of PCT/EP03/02031 filed on Feb. 27, 2003, published on Sep. 12, 2003 under publication number WO 03/074753 and which claims priority benefits from German patent application number DE 102 09 423.3 filed Mar. 5, 2002.

The invention relates to a coating comprising a getter metal alloy and to an apparatus and method for the production thereof, in accordance with the preambles of the independent claims.

Getter metals, which include substances used for binding the last traces of disruptive or harmful gases from high vacuum chambers by means of sorption or direct chemical reaction, can be divided into two groups. The first group is formed by the vaporisable getter metals, which are vaporised in a tubular flask during the first heating-up of the tube and which, in the process, bind the last traces of disruptive or harmful gases from the high-vacuum chamber by means of sorption or direct chemical reaction. These include the getter metals that vaporise at low temperature: caesium, having a vaporisation temperature of 678° C.; sodium, having a vaporisation temperature of 882° C.; magnesium, having a vaporisation temperature of 1,090° C.; calcium, having a vaporisation temperature of 1,484° C.; and barium, having a vaporisation temperature of 1,640° C. The other group of getter metals consists of metals which do not have to be vaporised to produce their action but rather vaporise only at temperatures above 3,000° C., and yet exhibit gettering action in some cases even at activation temperatures of 120° C. and above. This group of non-vaporisable getter metals includes the metals: titanium, having a vaporisation temperature of 3,287° C.; zirconium, having a vaporisation temperature of 4,377° C.; and hafnium, having a vaporisation temperature of 4,602° C.

Coatings comprising such non-vaporising getter metals are used for getter pumps, wherein the non-vaporising getter metal is heated in vacuo so that, at an activation temperature which is typical for a specific getter metal alloy, the chemical reactive gases, which are initially bound to the surface, diffuse into the solid body of the getter metal. After cooling of the getter metal, for example to room temperature, reactive residual gas components such as oxygen molecules or water molecules can again be bound to its reactive surface.

The action of the getter metal alloy may, however, be impaired by the inclusion of noble gases with which the getter alloys become encumbered during production of the getter pump surfaces. That encumbrance with noble gases such as argon or krypton can reduce the take-up capacity, that is to say the sorption capability of the getter pump surface, because a proportion of the activation positions at the surface and in the interior of the getter pump metals are shielded by, or encumbered with, noble gas inclusions. There is, furthermore, a risk of the "re-emission of gas", that is to say of the included noble gas molecules diffusing out again from the getter material and impairing the UHV.

There is also a substantial technical problem in the production of getter pumps. Because of the high melting point of the non-vaporising getter metal alloys, it is not possible for the getter alloys to be sintered or vapour-deposited onto the surfaces of a getter pump, as is otherwise carried out in the case of vaporisable getter metal alloys. A technique has therefore become established wherein a fine vacuum region having a residual gas pressure of about 2 Pa of a noble gas such as argon or krypton is established and that residual gas is subjected to a gas discharge. A sacrificial cathode held at negative potential is, in the process, atomised by the positively charged gas ions in a sputtering process. In that sputtering process, not only is the sacrificial cathode comprising getter metal atomised but also a proportion of the sputtering gas such as argon or krypton is incorporated in the getter pump coating. In addition, that process has the further disadvantage that, because of the low atomisation rate of the high-melting getter metals in the sputtering process, it takes an extremely long time to build up the getter pump layer. Accordingly, only thin getter layers or layer thicknesses can be applied within an acceptable period, which in turn limits the getter pump action over time, because the take-up capacity of the volume of the coating is extremely limited because of the minimal thickness.

The problem of the invention is to overcome the disadvantages of the prior art and to provide a coating comprising a non-vaporising getter metal alloy for an inner wall of an ultra-high-vacuum vessel, which coating has, on the one hand, a high take-up capacity for residual gases and, in addition, permits a high number of pumping cycles before the volume is filled with reactive residual gases.

The problem is solved by the subject-matter of the independent claims. Features of further advantageous embodiments of the invention are to be found in the dependent claims.

In accordance with the invention there is proposed a coating comprising a non-vaporising getter metal alloy for an inner wall of an ultra-high-vacuum vessel, the getter metal alloy comprising at least one getter metal having a melting point above 1,500° C. and a vaporisation temperature above 3,000° C. The getter metal alloy coating therein is not encumbered with noble gas inclusions and comprises a metal alloy deposition product from a noble-gas-free getter metal alloy plasma. This coating has the advantage that it is not a noble gas sputtering product but rather is a metal alloy deposition product originating from a noble-gas-free getter metal alloy plasma. Such getter metal alloy layers can be produced in substantially greater thickness in substantially shorter processing times so that a high take-up capacity of reactive residual gases is a substantial advantage of the getter metal coating according to the invention. Furthermore, the take-up capacity for reactive gases is increased still further because there are no inclusions of noble gas metals to reduce the take-up capacity.

In a preferred embodiment of the invention, the getter metal alloy comprises titanium, zirconium and/or vanadium, vanadium not belonging directly to the non-vaporising getter metals but rather being used herein as a bonding metal for the titanium and zirconium constituents which do have a gettering action.

In a further preferred embodiment of the invention, the getter metal alloy comprises titanium, zirconium and/or hafnium. This composition results in a getter alloy which is held together by the titanium, all three components having gettering actions and correspondingly high activation temperatures. A further getter alloy is characterised in that it comprises vanadium, zirconium and hafnium. Here too, the vanadium is not a metal which directly exerts a gettering action but rather it helps stimulate the zirconium and hafnium constituents in their gettering action and the homogeneous mixing of the one with the other.

In a further preferred embodiment of the invention, the getter metal alloy has an activation temperature between 120 and 500° C. That activation temperature range between 120 and 500° C. can be achieved by varying the proportions of the getter metal alloys involved. A preferred sub-set from that range comprises getter metal alloys having an activation temperature below 200° C. and above 120° C. Such activation temperatures correspond to the bake-out temperatures in normal high-vacuum operation so that the getter coating and bake-out operation for producing an ultra-high vacuum can be combined.

In a further advantageous development of the invention, the getter metal alloy has an activation temperature above 250 and up to 500° C. In this case, the combination of titanium, zirconium and hafnium is especially suitable as the getter metal alloy, especially as, with hafnium, a getter metal having the highest melting point and the highest vaporisation temperature is included in the coating. This range, which is substantially higher than the standard bake-out temperature, has the advantage that baking-out can be carried out separately in a plurality of steps at relatively low temperatures between 100 and 150° C. and then, only once the residual atmosphere in the high vacuum vessel is completely dry, reactivation of the surface of the getter materials is carried out at temperatures substantially above the bake-out temperature, between 250 and 500° C. When that reactivation cycle is repeated a number of times, by re-establishing a high activation temperature of such a kind after cooling, an ultra-high vacuum can be reproduced a number of times in a high-vacuum vessel.

In order to carry out production of a getter metal alloy coating on an inner wall of a high-vacuum vessel to be coated, the following arrangement is provided in accordance with the invention: the arrangement basically comprises a metal plasma generator, which in turn comprises the following components:

- an insulator member having an ignition electrode and having a cathode wire comprising a getter metal alloy, the ignition electrode and cathode wire being connectible to an ignition pulse generator and to a cathode potential, respectively, and the ignition electrode and the cathode wire being arranged on the insulator member spatially separated from one another;
- a cage-shaped anode member, which surrounds the insulator member, spatially spaced apart therefrom, and which is connectible to an anode potential, the insulator member and the surrounding anode member projecting, during coating, into the interior of the high vacuum vessel to be coated;
- a voltage supply apparatus having a cathode potential switching device for application of the cathode potential by way of a vacuum port to the cathode wire and for the application of a high-voltage ignition pulse by way of a vacuum high-voltage port to the ignition electrode and for the connection of the anode potential to the high-vacuum vessel to be coated and to the anode member.

By means of this relatively simple arrangement it is possible for the cathode wire, after ignition, to be converted into a plasma which spreads out towards the anode cage and sprays a metal plasma through the openings in the cathode cage onto the inner wall of the high-vacuum vessel, especially as the high-vacuum vessel is held at the same anode potential as the cage-shaped anode member. On application of an ignition pulse of more than 10 kV, the ignition electrode gives rise to a metal plasma which spreads over the insulator member and ignites the cathode-anode gap so that cathode material is converted successively into a metal plasma and sprayed onto the inner wall of the high-vacuum vessel.

The thickness of the getter metal coating sprayed onto the inner wall of the high-vacuum vessel is accordingly dependent on the thickness of the cathode wire converted as a getter metal alloy into a getter metal plasma. This effect, also known as a light arc, releases substantially more metal plasma per second than a sputtering process is capable of in one hour. To that extent, extremely thick getter metal alloy layers can be produced, which have a correspondingly high reactive gas take-up capacity.

In principle, an arrangement having a metal plasma generator can be constructed in two versions; in a first version, the metal plasma generator is in the form of a metal plasma spray head and, in a second basic case, the plasma generator is in the form of a metal plasma spray rod. Accordingly, in the first case, the arrangement has, firstly, a metal plasma spray head, which comprises the insulator member together with the cathode wire and ignition electrode and the surrounding anode member and is arranged to be moved under a high vacuum within the interior of the high-vacuum vessel to be coated.

A metal plasma spray head of such a kind has the advantage that it can be moved at different speeds in individual sections of a vacuum vessel and consequently the thickness of the getter metal coating can be produced in variable manner, for example variably in the axial direction. In a preferred embodiment of the invention, the arrangement therefor has a high-vacuum slide-through port, which enables linear displacement of the metal plasma spray head within the interior of the high-vacuum vessel to be coated. This arrangement has the advantage that it can be flange-mounted on high-vacuum tubular parts of any desired length and the high-vacuum slide-through port can be constructed in dependence upon the length of the high-vacuum tube to be coated.

In a further preferred embodiment of the invention, the arrangement has a metal plasma spray rod, which comprises an insulator rod as insulator member having an ignition electrode and, on its envelope surface, a wound-on cathode-wire and also the surrounding anode member and which is arranged in the interior of the high-vacuum vessel to be coated. A metal plasma spray rod of such a kind has the advantage that there is only required a flange which carries the high-vacuum spray rod and is to be flange-mounted on a high-vacuum tube to be coated or on a high-vacuum vessel to be coated. Any high-vacuum slide-through ports can be omitted in the case of this metal plasma spray rod.

In principle, the insulator member of the metal plasma spray rod has, in its centre, an ignition supply line, which extends to the end face of the insulator rod, where it terminates in an ignition electrode. That ignition electrode can be in disc form or in the form of a ring plate, an ignition pulse for ignition of the getter metal plasma first being applied, by way of the supply line, to the ignition electrode and an ignition plasma occurring at the end face, between the ignition electrode and the cathode wire, which plasma is propagated towards the anode and persists if, in the meantime, the wound-on cathode wire has been connected to a cathode potential and the anode member together with the high-vacuum vessel wall has been connected to a ground potential.

The cathode wire can have a plurality of windings in parallel on the insulator member. A corresponding number of metal plasma threads then extend beyond the anode to the inner wall of the high-vacuum vessel. For example, in the case of an arrangement of four cathode wires distributed on the circumference of the insulator rod, four revolving getter metal plasma gaps are formed, which persist either for as long as the cathode potential is applied or for as long as a cathode wire is still present. In the process, it must be ensured that the cathode wire, starting from the end face and continuing to the end of the insulator rod, directs a metal plasma beam towards the cage-shaped anode and, from there, onto the inner wall of the high-vacuum vessel.

In order to ensure that, in the case of the metal plasma spray rod, the metal plasma starts in the region of the end face and then continues to the end of the insulator rod, the insulator rod has, in a preferred embodiment of the invention, a cone in the axial direction, the radius of which increases in the axial direction towards the end face of the insulator rod. Accordingly, the smallest spacing between the anode member in the form of an anode cage and the cathode wire is ensured at the end face, and a light arc comprising a getter metal alloy will spread out, revolving around the insulator rod, in the direction of the vacuum port of the cathode wire and uniformly coat the inner wall of the high-vacuum vessel. The cone angle of the cone-shaped insulator rod can be between 1° and 15°. A shallow angle of such a kind is sufficient to ensure that the getter metal alloy plasma spreads out starting from the end face and following the metal plasma spray rod.

The cage-shaped anode, which surrounds the cathode wire spatially spaced apart therefrom, could, by virtue of the cage structure, give rise to a correspondingly structured inner wall coating on the inner wall of the high-vacuum vessel. In order to avoid a structured coating of such a kind, the arrangement can comprise a rotary port for the metal plasma spray rod and/or the metal plasma spray head so that, with continuous rotation of the metal plasma spray rod or plasma spray head together with the anode, a uniform thickness is achieved for the getter metal coating on the inner wall of the high-vacuum vessel.

In order to stabilise the position both of the metal plasma spray rod and also of the metal plasma spray head, each of these can be carried by a supporting flange, which can be flange-mounted in vacuum-tight manner on the high-vacuum vessel to be coated. A supporting flange of such a kind has the advantage that the apparatus can be flange-mounted relatively simply on any desired high-vacuum vessel provided that the latter has a sufficiently large opening which can be sealed in vacuum-tight manner by the supporting flange.

The cage-shaped anode member can be formed by a wire grating. In a preferred embodiment of such a kind, the wire grating rods are preferably welded to one another at their crossing points in order, on the one hand, to achieve a high degree of stability for the anode cage and, on the other hand, to ensure a uniform distribution of potential in spite of the metal plasma stream. In a further preferred embodiment of the invention, the cage-shaped anode member is formed by a perforated plate. A perforated plate has even greater stability than a wire mesh as anode member. The material of the anode member comprises a high-melting metal alloy having a melting point above 1,500° C. and a vaporisation temperature above 3,000° C., which is intended to ensure that the hot metal plasma does not incorporate any material from the anode member in the getter metal coating.

In a further preferred embodiment of the invention, the anode member consists of a getter metal alloy which has a higher vaporisation temperature than the getter metal alloy of the cathode wire. This has the advantage that, in the event of contamination of the getter metal coating with anode member material, there is likewise merely incorporated a getter metal alloy which assists in the getter metal action of the coating and does not, as in the prior art, hinder the activity of the getter metal coating by means of noble gas ions. Hafnium, having the highest melting point and the highest vaporisation temperature of the getter metals, can be used in this instance as an especially suitable material.

In a further preferred embodiment of the invention, the ignition electrode is arranged at that end face of the insulator member which projects into the high-vacuum vessel. That position of the ignition electrode ensures that the metal plasma starts in the region of the end face of the insulator member and has the advantage that the ignition electrode can be started by relatively simple means. For that purpose, the insulator member comprises a cylindrical ceramic tube having, in its axial region, a supply wire leading to a central metal plate as the ignition electrode on the end face of the insulator member, resulting in relatively simple assembly and fixing of the ignition electrode in the centre of the end face of a getter metal plasma spray rod.

In the case of a getter metal plasma spray head, the insulator member is, in a preferred embodiment of the invention, in the form of a ceramic ring. The ring opening of that ceramic ring carries a bundle of cathode wires, while the ignition electrode in the form of a metal ring is mounted on the ceramic ring. The metal ring, as the ignition electrode arranged in this instance on the ceramic ring as the insulator member, has a corresponding ignition supply line, which is in operative connection with the voltage supply apparatus.

For ignition, an ignition pulse is passed to the metal ring by way of the ignition supply line so that, from the bundle of cathode wires in the ring opening of the ceramic ring, which are held at cathode potential, a metal plasma spreads out in a radial direction, extending to the spatially surrounding cage-shaped anode and, through the latter, coating the inner wall of the vacuum vessel, which inner wall is held at anode potential. Even though the ignition electrode is subjected to a high voltage of several tens of kV only for the duration of one or several ignition pulses, even that can contribute to contamination of the getter metal alloy with ignition electrode material. For that reason, in an advantageous development of the invention, a high-melting metal alloy having a melting point above 1,500° C. and a vaporisation temperature above 3,000° C. is provided for the ignition electrode. For ignition electrodes that are especially stable and intended for a high-purity getter metal coating, a getter metal alloy is used which has a higher vaporisation temperature than the getter metal alloy of the cathode wire. In that instance, contamination with getter metal of the ignition electrode can improve rather than diminish the quality of the getter metal coating.

A particular application for a getter metal coating of such a kind consists in the high-vacuum vessel to be coated being a beam guidance tube of an ion beam acceleration system.

A method for the production of a coating comprising a non-vaporising getter metal alloy on an inner wall of a high-vacuum vessel to be coated comprises the following method steps:

Firstly, a plasma light arc is ignited between a cathode wire comprising a getter metal alloy and an anode member by means of a high-voltage ignition pulse. Then, with continuing conversion of the cathode wire into a getter metal alloy plasma while maintaining a metal plasma light arc between the cathode wire and a cage-shaped anode member spatially surrounding the cathode wire, the inner wall of the high-vacuum vessel is plasma-coated. Finally, the coated ultra-high-vacuum vessel is, after coating, closed in gas-tight manner until installation of the high-vacuum vessel in an ultra-high-vacuum system.

For ignition of the light arc between the cathode wire and the cage-shaped anode, a high-voltage ignition pulse in the range from −18 kV to −30 kV is applied to the ignition electrode on the insulator member by way of an ignition pulse supply. That ignition pulse is sufficient to initiate a first metal plasma, which then spreads out between the cathode wire and the cage-shaped anode.

In a preferred example of implementation of the method, for the maintenance of a getter metal light arc between the cathode wire and cage-shaped anode member and the inner wall of the high-vacuum vessel, the anode member and the inner wall of the high-vacuum vessel are held at ground potential and the cathode wire is held at a cathode potential between −100 V and −300 V. That voltage, which is low in comparison with the ignition pulse, is sufficient to maintain a getter metal alloy plasma until all the cathode wire has been used up.

In a further preferred example of implementation of the method, a metal plasma spray head as metal plasma generator, which comprises an insulator member having a cathode wire bundle and ignition electrode and the surrounding anode member, is, after ignition of the getter metal alloy plasma, moved linearly, by means of a linear high-voltage slide-through port, within the interior of the high-voltage vessel to be coated, the getter metal alloy of the cathode wire bundle being deposited, with plasma formation, on the inner wall of the high-voltage vessel to be coated. As a result of the mechanical movement of the spray head within the high-vacuum vessel to be coated, the length of the high-vacuum vessel to be coated is limited only by the possible length of the linear port for the supply of the metal plasma spray head. This has the advantage that the same metal plasma spray head can always be used for different lengths of high-vacuum vessel provided that the length of the vessel does not exceed the length of the slide-through port.

It is possible to dispense with a slide-through port of such a kind when a metal plasma spray rod matched to the length of the high-vacuum vessel is used. In that embodiment of the method, the getter metal alloy of the cathode wire, wound onto an insulator rod, of a metal plasma spray rod as plasma generator is deposited as a getter metal coating on the inner wall of the high-vacuum vessel to be coated, starting from the end face of the metal plasma spray rod, with subsequently occurring metal plasma formation of the cathode wire windings. A method of such a kind has the advantage that, immediately after ignition by an ignition pulse, the metal plasma can be maintained until the cathode wire has been used up or until the cathode potential has been switched off.

In a further example of implementation of the method, the metal plasma generator is rotated, during deposition of the getter metal alloy, by means of a high-vacuum rotary port. In that method comprising simultaneous rotation of the metal plasma generator, be it in the form of a metal plasma spray head or in the form of a metal plasma spray rod, it is ensured that a getter metal alloy layer of relatively uniform thickness is deposited on the inner wall of the high-vacuum vessel.

In a further preferred example of implementation of the method, the thickness of the coating of getter metal alloy is, when the metal plasma spray rod is used, controlled by the thickness of the cathode wire. As a result of a thicker cathode wire it is also possible for a greater amount to be deposited on the inner wall of the vessel, making it possible for the thickness of the getter metal coating for the high-vacuum vessel to be calculated in advance by simple but effective means.

Whereas the thickness of the cathode wire is crucial in the case of a metal plasma generator based on a metal plasma spray rod, the thickness of the coating is, when a metal plasma spray head is used, governed by the speed at which the metal plasma spray head is moved through the high-vacuum vessel in the longitudinal direction. At a slow, that is to say low, speed, the coating becomes thicker; at a higher speed, the thickness of the coating is reduced accordingly. The bundle of cathode wires in the centre of the annular insulator member of the metal plasma spray head is, for the purpose, continuously advanced for adequate replenishment of the getter material.

A preferred application of the method is intended for the production of a getter metal alloy coating in an ion beam guidance tube. Ion beam guidance tubes of such a kind are used in ion beam acceleration systems, and large-area getter pumps are produced in the inner walls—improved by the method—of the ion beam guidance tubes. The costs for maintenance, cleaning and evacuation of the ion beam acceleration system can be reduced as a result.

Further advantages and features of the present invention will be explained below in further detail by means of embodiments referring to the accompanying drawings.

FIG. 1 shows diagrammatic views of an arrangement for the production of a getter metal alloy coating of a first embodiment of the invention.

FIG. 1a shows a sectional view in the plane of section A-A of FIG. 1b.

FIG. 1b shows, in basic diagrammatic form, a partially broken away high-vacuum vessel having a metal plasma spray rod:

FIG. 2 shows diagrammatic views of an arrangement for the production of a getter metal alloy coating of a second embodiment of the invention.

FIG. 2a shows a sectional view in the plane of section along line B-B of FIG. 2b.

FIG. 2b shows, in basic diagrammatic form, a partially broken away high-vacuum vessel having a metal plasma spray rod.

FIG. 3 shows diagrammatic views of an arrangement for the production of a getter metal alloy coating of a third embodiment of the invention.

FIG. 3a shows a sectional view in the plane of section along line C-C of FIG. 3b.

FIG. 3b shows, in basic diagrammatic form, a partially broken away high-vacuum vessel having a metal plasma spray head.

FIG. 1 shows diagrammatic views of an arrangement for the production of a getter metal alloy coating 1 of a first embodiment of the invention. FIG. 1 a firstly shows a sectional view in the plane of section A-A of FIG. 1b. The sectional view in FIG. 1a shows a high-vacuum vessel 5 of circular cross-section, which as a result of coating of its inner wall 3 with a getter metal alloy coating 1 is improved to form an ultra-high-vacuum vessel 4. For that purpose, an insulator member 8 projects, as shown in FIG. 1b, into the cylindrical high-vacuum vessel 5 of circular cross-section, which insulator member is in the form of a rod and has, on its circumference, four coils running in the same direction having parallel-extending windings of a cathode wire 10. The cathode wire windings arranged on the envelope surface 25 comprise getter metal alloys.

In this embodiment, the getter metal alloy 2 consists of three components, namely titanium, zirconium and vanadium, titanium and zirconium being highly active getter metals. By modifying the volumetric ratios and the nature of the alloy components, the activation temperature can be adjusted between 120° C. and 500° C. A low activation temperature between 120° C. and 200° C. is especially advantageous when the reactivation of the surface of the getter metal alloy coating is also to be carried out at the same time as a baking-out procedure for the high-vacuum vessel 5.

When an activation temperature substantially above the bake-out temperature is desired, in order to separate baking-out for achieving a high vacuum from the reactivation of the getter metal coating 1, in order to achieve multiple reactivation of the getter metal alloy coating 1 independently of the completed heated-out process, an additional metal which melts and vaporises at extremely high temperatures, namely hafnium, is used, which has a melting point of 2,227° C. and a vaporisation temperature of 4,602° C. For that purpose the low-melting titanium, having a melting point of 1,660° C.±10° C. and a vaporisation temperature of 3,287° C., is replaced by the hafnium. On the other hand, the high-melting vanadium can also be replaced by hafnium, especially as the getter action of vanadium is not as great as that of hafnium. Using a getter metal coating comprising hafnium as the third component it is consequently possible to achieve an improved ultra-high vacuum, because the reactivation of the coating 1 can be carried out a number of times at elevated temperature between 200° C. and 500° C. in order to achieve an ultra-high vacuum.

In order to provide the inner wall 3 of the high-vacuum vessel 5 with a getter metal alloy coating 1, the cathode wire 10 comprising a getter metal alloy 2 wound onto the insulator rod 8 is ignited at the end face 27 of the metal plasma spray rod 23 and, in the case of a multiple coil, as can be seen in FIG. 1a, four metal plasma tracks 6 form in the high vacuum, which, as can be seen in FIG. 1a, rotate clockwise in the direction of the arrow U as the cathode wire coils are used up and, in the process, coat the inner wall 3 of the high-vacuum vessel 5 with a noble-gas-free getter meal coating 1 from a pure getter metal alloy plasma 6. For that purpose, the cathode 10 on the insulator member 8 is surrounded, at a spatial spacing d, by a cage-shaped anode member 13.

The cage-shaped anode member 13 can be constructed from a wire grating 30 or a perforated plate 40, the anode member 13 and the wall of the high-vacuum vessel 5 being held at a ground potential whereas, on the other hand, the cathode wire 10 is maintained at a voltage of from −100 to −300 V. That voltage is supplied to the cathode wire 10 by way of a high-vacuum port 18. With such a low voltage difference between the anode member 13 and the cathode wire 10, however, it is not possible to ignite a metal plasma. For that purpose, the insulator member 8, which carries the cathode wire 10 on its envelope surface 25, has, as can be seen in FIG. 1b, a central high-voltage supply wire 33, which is connected at the end face 27 of the insulator rod 24 to a circular metal plate 34 as the ignition electrode 9.

On application of a high voltage of more than 10 kV, which in this embodiment of the invention is at least 18 kV, a plasma firstly forms between the ignition electrode 9 and the cathode wire 10 at the end face 27 of the insulator member 8, ensuring ignition of the cathode-anode gap. In order, on the one hand, not to incorporate any foreign metals in the getter metal coating 1 but to include only getter metals, the ignition electrode 9 can be made from a getter metal having a high melting point and vapourising at a high temperature. The same applies to the cage-shaped anode member 13, which can be produced from a getter metal wire or getter metal plate having a high melting point and vapourising at a high temperature.

After ignition of the cathode wires 10 at the end face 27 of the metal plasma spray rod 23, the cathode wire 10 is used up while a metal plasma light arc 43 rotates, the rotating four-rayed metal plasma light arc 42 moving in the direction of arrow F towards the high-vacuum port 18 and consequently coating the inner wall 3 over the entire length of the tubular high-vacuum vessel 4. In the process, the available getter metal wire of the cathode governs the thickness of the getter metal alloy coating 1 applied with the aid of the metal plasma. The stock of getter metal can be adjusted in variable manner by means of the wire diameter of the cathode wire 10. The procedure of using up the cathode material occurs relatively quickly in a light arc process, which is similar to this coating procedure, so that in a short time the entire high-vacuum vessel 5 is coated on its inner wall 3 with a getter metal alloy 2 of predeterminable thickness.

FIG. 1b shows, in basic diagrammatic form, a partially broken away high-vacuum vessel 5 having a metal plasma spray rod 23 in the centre of the high-vacuum vessel 4, which, as mentioned hereinbefore, is of tubular form. The metal plasma spray rod 23 basically consists of a cylindrical insulator member 8, which has, on its cylindrical envelope surface 25, as already described hereinbefore, a plurality of coils of cathode wires 10, which can be ignited, starting from the end face 27 of the insulator member 8, by means of a high-voltage supply 33 so that, starting from the end face 27, a metal plasma arc is formed which coats the entire inner wall 3 of the high-vacuum vessel 5. The getter metal alloy coating 1 produced in the process is shown by a line of dots and dashes 44 in FIG. 1b, whereas the anode member 13 arranged at a spatial spacing d from the insulator member 8 is indicated by a line of dashes 45. That line of dashes 45 is, at the same time, intended to indicate that the anode member 13 can consist either of a perforated plate 40 or of a wire grating 30.

A line of dashes and double dots 46 outlines the region of a voltage supply apparatus 16, which can, on the one hand, supply the ignition pulse 19 to the ignition electrode 9, more specifically by way of the supply line 33, 39, which is passed through in a vacuum high-voltage port 20. For that purpose an ignition pulse generator 11 is actuated. In addition, the voltage supply apparatus 16 has a source for the cathode current, which is connected with a voltage between −100 and −300 V by way of the switch 17 between the anode member, which is held at ground potential, and the cathode wire 10. Finally, the voltage supply apparatus 16 comprises a supply line for the anode potential 14, which in this embodiment of the invention, together with the high-vacuum vessel 5, is held at a ground potential.

The metal plasma generator 7, which in this embodiment basically consists of a metal plasma spray rod 23 and projects into the high-vacuum vessel 5, is held by a supporting flange 29, which is matched to a corresponding high-vacuum flange of the high-vacuum vessel 5.

FIG. 2 shows diagrammatic views of an arrangement for the production of a getter metal coating 1 of a second embodiment of the invention, FIG. 2a showing a sectional view in the plane of section along line B-B of FIG. 2b and FIG. 2b showing, in basic diagrammatic form, a partially broken away high-vacuum vessel 5 having a metal plasma spray rod 23. Components having the same functions as in the preceding Figures are referred to by the same reference numerals and are not separately discussed.

The basic difference between the embodiment according to FIG. 1 and the embodiment according to FIG. 2 lies in the fact that the metal plasma spray rod 23 in FIG. 2b has a conical shape and its radius increases towards the end face 27, the angle of the cone being between 1° and 15°. That conical shape of the metal plasma spray rod 23 results in the fact that, on the one hand, the metal plasma starts at the end face 27, at which the ignition electrode 9 in the form of a central metal plate 34 is also located, and the spatial spacing d between the anode member 13 and the cathode wire 10 increases towards the high-vacuum port 18 so that usage of the cathode wire 10 passes in defined manner from the end face 27 to the high-vacuum ports 18 and 20, without it being possible for interruption of the cathode wire 10 to occur in the meantime. The conical shape consequently ensures that successive conversion of the cathode wire material into the metal plasma is guaranteed. A further difference from the first embodiment of the invention lies in the fact that in this case eight, instead of four, cathode wire coils are now arranged in parallel on the conically tapering insulator member 8, which contributes to making the plasma cloud more uniform.

FIG. 3 shows diagrammatic view of an arrangement for the production of a getter metal coating 1 of a third embodiment of the invention, FIG. 3a showing a sectional view in the plane of section along line C-C of FIG. 3b and FIG. 3b showing, in basic diagrammatic form, a partially broken away high-vacuum vessel 5 having a metal plasma spray head 21. Components having the same functions as in the preceding Figures are referred to by the same reference numerals and are not separately discussed.

The basic difference from the first two embodiments lies in the fact that the getter metal alloy plasma 6 is produced using a metal plasma spray head 21 and not with a metal plasma spray rod 23. This metal plasma spray head 21 has an annular insulator member 8, on which there is arranged a metal ring 38 or an annular coating as ignition electrode. In the centre of the insulator member 8 in the form of a ring, that is to say in the ring opening 36, the metal plasma spray head 21 has a bundle 37 of cathode wires 10. On application of an ignition pulse 19 to the annular ignition electrode 9, that bundle 37 forms a plasma which spreads out towards the spatially surrounding anode member 13 and, through the cage-shaped anode member 13, coats the inner wall 3 of the high-vacuum vessel 5 with a getter metal alloy coating 1.

The cathode wire bundle 10 can be continuously replenished in the ring opening 36 so that a source of getter metal alloys 2 which can be extended as desired is available. In addition, the arrangement comprises a slide-through port 22, by means of which the spray head 21 can be linearly displaced in the directions of arrows D and E. For that purpose, a high-vacuum-tight bellows 47 is flange-mounted by means of a corresponding supporting flange 29 at an end face 27 of the high-vacuum vessel 5 in vacuum-tight manner. The supporting flange 29 has a slide-through port 22 so that the metal plasma spray head 21 can be linearly displaced in the axial direction of the high-vacuum vessel 5 and accordingly a uniform coating 1 of the inner wall 3 with a getter metal alloy coating 1 can be achieved.

The thickness of the coating 1 is not dependent on the stock of cathode wire material in the ring opening 36 but rather only on the speed of movement with which the spray head 21 is moved through the high-vacuum vessel 5. Accordingly, by means of this arrangement, getter metal coatings 1 of any desired thickness are possible. Both the first and also the second and third embodiments of the invention, as shown in FIGS. 1 to 3, can have a rotary port in the supporting flange 29 so that the metal plasma spray rods 23 and the metal plasma spray head 21 can be rotated, in order to achieve a uniform layer thickness for the getter metal alloy 2 on the inner wall 3 of the high-vacuum vessel 5. By virtue of rotation of the entire plasma generator 7, an image of the cage-shaped anode member is not projected onto the inner wall 3 of the high-vacuum vessel 5, which can possibly result in differences in the layer thickness.

In individual applications, variation of the layer thickness in the form of a projected image of the cage-shaped anode member is desirable in order to increase the reactive surface of the getter metal alloy coating 1. However, in that case, the regions which have the thinnest getter metal coating 1 are critical for the service life or useful life of the getter metal coating 1.

By means of all three embodiments of the arrangement according to the invention for the production of a getter metal alloy coating, the above-mentioned methods for the production of a getter metal coating can be carried out successfully and without inclusion of noble gases in the getter metal alloy coating. Compared to conventional methods, which operate using noble gas sputtering, the duration of the method is substantially reduced because it is not necessary for high-melting metals to be atomised by noble gas ions. Also, by means of the method according to the invention using these embodiments—shown in FIGS. 1 to 3—of an arrangement for the production of such getter metal alloy coatings 1, the layer thickness can be achieved in any desired thickness in an acceptable processing time.

In principle there is provided, by means of the method and the apparatus, a large-area getter metal pump for which the entire inner wall 3 of a high-vacuum vessel 5 is available. This is of special interest for ultra-high-vacuum vessels 4 for the guidance of ion beams in a cyclotron or in a linear accelerator or in a transport channel for high-energy ions. When a getter metal alloy coating 1 has to be renewed, the used getter metal alloy coating can be removed by means of reverse poling in an electro-polishing process, the arrangements required therefor being similar to the arrangement shown in FIGS. 1 to 3. After electro-polishing of the inner walls 3 of the vessels 5, a new ultra-high-vacuum-supporting getter metal alloy coating 1 can then be applied again with little outlay, appropriate metal plasma generators 7 being flange-mounted on the high-vacuum vessels 5 to be coated.

LIST OF REFERENCE SYMBOLS 1 coating
2 getter metal alloy
3 inner wall
4 ultra-high-vacuum vessel
5 high-vacuum vessel to be coated
6 getter metal alloy plasma
7 metal plasma generator
8 insulator member
9 ignition electrode
10 cathode wire
11 ignition pulse generator
12 cathode potential
13 anode member
14 anode potential
15 interior
16 voltage supply apparatus
17 cathode potential switching device
18 high-vacuum port
19 high-voltage ignition pulse
20 vacuum high-voltage port
21 metal plasma spray head
22 slide-through port
23 metal plasma spray rod
24 insulator rod
25 envelope surface of insulator rod
26 cone of insulator rod
27 end face
28 high-vacuum rotary port
29 supporting flange
30 wire grating
31 cylindrical ceramic tube
32 axial region
33 supply wire
34 central metal plate (ignition electrode)
35 ceramic ring
36 ring opening
37 cathode wire bundle
38 metal ring
39 ignition line of spray head
40 perforated plate
41 ion beam guidance tube
42 light arc
43 metal plasma light arc
44 line of dashes
45 line of dots and dashes 46 line of dashes and double dots
47 bellows
A-A lines of section in the corresponding Figures
B-B 1*b*, 2*b* and 3*b*
C-C
D, E linear movement directions
d spatial spacing between anode member and insulator member
α cone angle

The invention claimed is:

1. A method for the production of a coating comprising a non-vaporising getter metal alloy on an inner wall of a high-vacuum vessel to be coated, the getter metal alloy comprising at least one getter metal having a melting point above 1,500° C. and a vaporisation temperature above 3,000° C., and the method comprising the following method steps:
    ignition of a light arc between a cathode wire wound on an insulator rod comprising a getter metal alloy and an anode member by means of a high-voltage ignition pulse,
    continuing conversion of the cathode wire into a getter metal alloy plasma while maintaining a metal plasma light arc between the cathode wire and a cage-shaped anode member spatially surrounding the cathode wire, wherein the metal plasma arc rotates about the insulator rod as the cathode wire is used up,
    plasma coating, under a high vacuum, of the inner wall of the high-vacuum vessel to be coated,
    gas-tight closure of the coated ultra-high-vacuum vessel after coating.

2. A method according to claim 1, wherein for ignition of the light arc, a high-voltage ignition pulse in the range from minus 18 kV to minus 30 kV is applied to an ignition electrode on an insulator member by way of an ignition pulse supply.

3. A method according to claim 1, wherein for the maintenance of a getter metal light arc between the cathode wire and anode member and the inner wall of the high-vacuum vessel to be coated, the anode member and the inner wall of the high-vacuum vessel to be coated are held at ground potential and the cathode wire is held at a cathode potential between −100 V and −300 V.

4. A method according to claim 1, wherein a metal plasma spray head as metal plasma generator, which comprises an insulator member having a cathode wire bundle and ignition electrode and the surrounding anode member, is, after ignition of the getter metal alloy plasma, moved linearly, by means of a linear high-vacuum slide-through port, within the interior of the high-vacuum vessel to be coated, the getter metal alloy of the cathode wire bundle being deposited, with plasma formation, on the inner wall of the high-vacuum vessel to be coated.

5. The method according to claim 1, wherein the getter metal alloy of the cathode wire, wound onto an insulator rod, of a metal plasma spray rod as plasma generator is deposited as a coating on the inner wall of the high-vacuum vessel to be coated, starting from the end face of the metal plasma spray rod, with successively occurring metal plasma formation of the cathode wire windings.

6. The method according to claim 1, wherein the metal plasma generator is rotated, during deposition of the getter metal alloy, by means of a high-vacuum rotary port.

7. The method according to claim 1, wherein the thickness of the coating of getter metal alloy is, when the metal plasma spray rod is used, controlled by the thickness of the cathode wire.

8. The method according to claim 1, wherein the thickness of the coating of getter metal alloy is, when the metal plasma spray head is used, controlled by the speed of movement of the metal plasma spray head in the axial direction of the high-vacuum vessel to be coated.

9. The method according to claim 1, wherein an ion beam guidance tube of an ion beam acceleration system is coated with the getter metal alloy in order to make possible an ultra-high vacuum in the ion beam guidance tube.

* * * * *